United States Patent
Bolde et al.

[11] Patent Number: 6,153,505
[45] Date of Patent: Nov. 28, 2000

[54] PLASTIC SOLDER ARRAY USING INJECTION MOLDED SOLDER

[75] Inventors: Lannie R. Bolde, New Paltz; Peter Alfred Gruber, Mohegan Lake; Chon Cheong Lei, Poughkeepsie, all of N.Y.

[73] Assignee: International Business Machines Corporation, Armonk, N.Y.

[21] Appl. No.: 09/388,300

[22] Filed: Sep. 1, 1999

Related U.S. Application Data

[62] Division of application No. 09/067,904, Apr. 27, 1998, Pat. No. 6,029,882.

[51] Int. Cl.⁷ .................................................. H01L 21/44
[52] U.S. Cl. ......................... 438/613; 438/615; 228/254; 228/180.22
[58] Field of Search ........................ 438/615, 613; 228/180.21, 180.22, 254

[56] References Cited

U.S. PATENT DOCUMENTS

| | | | |
|---|---|---|---|
| 4,585,157 | 4/1986 | Belcher | 228/180.2 |
| 4,979,664 | 12/1990 | Lyons et al. | 228/180.2 |
| 5,244,143 | 9/1993 | Ference | 228/180.21 |
| 5,547,894 | 8/1996 | Mandelman et al. | 437/56 |
| 5,551,148 | 9/1996 | Kazui et al. | 29/843 |
| 5,658,827 | 8/1997 | Aulicino et al. | 438/615 |
| 5,673,846 | 10/1997 | Gruber | 228/180.22 |
| 5,718,361 | 2/1998 | Braun et al. | 228/56.3 |
| 5,718,367 | 2/1998 | Covell, II et al. | 228/254 |
| 5,775,569 | 7/1998 | Berger et al. | 228/254 |
| 5,787,580 | 8/1998 | Woo | 228/180.22 |
| 5,803,340 | 9/1998 | Yeh et al. | 228/56.3 |
| 5,880,017 | 3/1999 | Schwiebert et al. | 438/613 |
| 5,909,634 | 6/1999 | Hotchkiss et al. | 438/613 |
| 5,950,908 | 9/1999 | Fujino et al. | 228/254 |

*Primary Examiner*—Kevin M. Picardat
*Attorney, Agent, or Firm*—Judith D. Olsen

[57] ABSTRACT

Disclosed is a solder injection mold apparatus and method for providing solder balls to a printed circuit board substrate using the solder injection mold apparatus in the plastic ball grid array (PBGA). The solder mold through holes are chamfered at entry and at exit ends to assist in receipt of molten solder and the formation and transfer of solder balls to lands on the substrate. A blind recess is provided in the second major surface of the mold, i.e. the side facing the substrate, in order to accommodate electronic components mounted thereon. Solder balls are delivered and metallurgically affixed to the lands in a process that requires only one reflow, leaving the through holes clean of solder and the mold ready for reuse. The material of which the substrate, mold and base plate are comprised is selected to be non-wettable by solder and mutually compatible with respect to CTE when exposed to temperatures of molten solder.

8 Claims, 3 Drawing Sheets

BOTTOM VIEW

RECESS 3

TOP VIEW

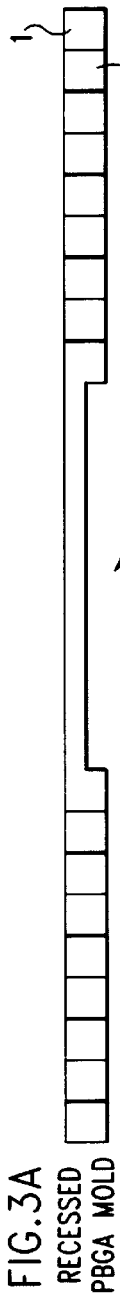
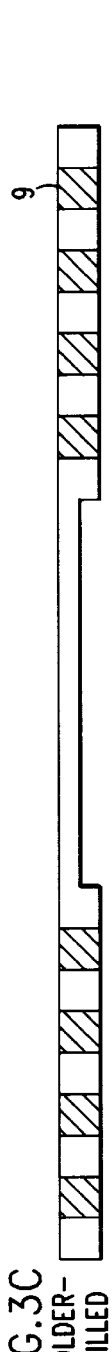
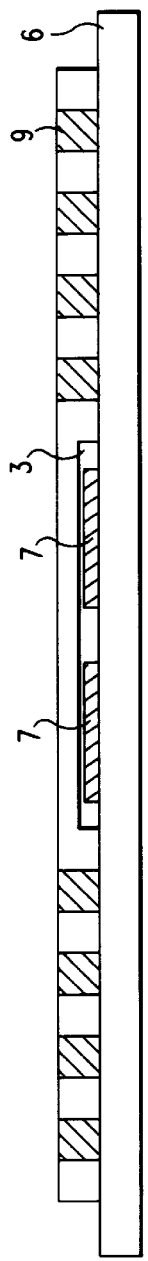
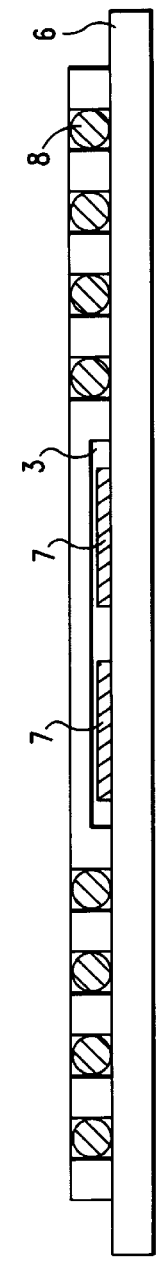
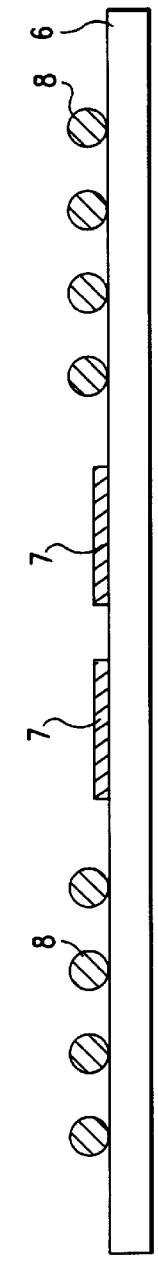
FIG. 3A RECESSED PBGA MOLD
FIG. 3B IMS FILL ON FLAT SIDE WITH EUTECTIC SOLDER
FIG. 3C SOLDER-FILLED MOLD
FIG. 3D RECESS CLEARS COMPONENTS
FIG. 3E REFLOW FOR TRANSFER
FIG. 3F COMPLETE PBGA SUBSTRATE

PLASTIC SOLDER ARRAY USING INJECTION MOLDED SOLDER

This is a division of application Ser. No. 09/067,904, filed Apr. 27, 1998, now U.S. Pat. No. 6,029,882.

FIELD OF THE INVENTION

This invention relates to the field of electronic packaging. More particularly, this invention relates to the packaging of integrated circuits (ICs) and mounting the ICs onto laminated printed circuit boards (PCBs) by means of solder balls using a technique known as plastic ball grid array (PBGA).

BACKGROUND OF THE INVENTION

ICs comprise a complex assortment of microminiature electronic components on a silicon chip. To protect them from damage due to handling and moisture, ICs are typically housed in a ceramic or plastic package that is either soldered to a PCB or inserted into a matching socket which has been soldered into a printed circuit board. For IC housing, ceramic is the material favored in high reliability industrial and military applications, plastic, being less costly, is favored in commercial and consumer products. Many millions of these types of structures are manufactured every year, worldwide. For the PCB substrate, FR4 resin laminate is becoming an industry norm because of its electrical, chemical and physical properties and its low cost.

Means by which the IC package has been attached electronically to a PCB or another IC include metal pins in plastic pin grid array (PPGA), silk screened solder paste, solder preforms and solder balls. Injection molded techniques have been used in some cases to apply solder. In PBGA, solder balls are heated to a temperature at which it will reflow, and the solder is applied to contact pads on the PCB, also referred to herein as lands, electrically connecting the IC to the PCB. Some of the plastic packages have material sculpted out from the middle to form a recess in which the IC die will be placed when the plastic parts are laminated together. After the IC die is installed in the package, electrical connections are made to the die contact pads and to solder through the conductive metal patterns within the package. These soldering processes may involve two reflow heating steps, the first reflow to attach solder at selected peripheral points on the surface of the laminate, and the second reflow to reshape the solder to a sphere.

U.S. Pat. No. 4,585,157 to Stephen R. Belcher describes a method of bonding two IC chips face-to-face in a type of lead frame wire bonding called tape automated bonding (TAB). Rather than testing a chip at a site on the lead frame, the patented method uses a tape bonding approach wherein the finger leads at a single site in a lead frame are divided into two groups and are bonded in two separate compression bonding processes. In the second bonding process, the first chip is flipped upside down and fit into a recess in a second thermode. The present invention is not directed to TAB, but rather is directed to a means and process of delivering discrete amounts of solder in PBGA to connection lands on a PCB having an IC mounted thereon.

U.S. Pat. No. 5,979,664 to Alan M. Lyons et al describes a method of treating solder used in mounting an IC to a PC board in order to eliminate oxide at the solder surface without flux. To remove the oxide without flux, nitrogen or argon gas is flowed over the heated areas being joined. Unlike the present invention, the patent is not directed to the solder delivery itself, and in particular not directed to a solder injection mold delivery system and process.

U.S. Pat. No. 5,244,143 to Ference et al, assigned to the same assignee as the present invention, describes various embodiments of injection mold apparatus for solder. In the present invention, an injection mold apparatus for use with PBGA is described and a process set forth which is particularly adapted to PBGA. The patent is useful for its description of the solder reservoir.

U.S. Pat. No. 5,551,148 to Kazui et al describes a flexible film having tapered through-holes filled with solder, which is heated and transferred under pressure from the larger diameter end of the through holes to a circuit board as bumps on pads. The transfer of solder is no good if the pressure is too low. At that point the flexible film is removed either by dissolving in hydrazine or ethylene diamine, sublimated by the heat of the soldering process, or peeled away. The solder injection mold of the present invention is not a flexible film, but a sturdy, reusable transfer device. Since it does not have to be dissolved, sublimated or peeled away, there is no handling of harsh chemicals or destruction or distortion of the injection mold used in the present invention.

None of the above references addresses the problems, achieves the results or discloses the process and apparatus of the present invention.

SUMMARY OF THE INVENTION

Accordingly it is an object of the invention to provide a solder injection mold and process which is particularly suitable for supplying solder to a PBGA structure.

It is a further object of the invention to provide a solder injection mold which will receive molten solder into a number of through-holes opening at a first major surface and dispense solder balls from those through-holes opening at a second major surface onto and in alignment with contact lands on the first major surface of a substrate, in particular onto a substrate having at least one electronic component mounted thereon, in a controlled and reliable fashion. It is a further object of the invention to maintain the solder in place in the through holes within the mold through reflow and cooling of the molten solder into balls, and to then remove the mold from the substrate, leaving the solder balls behind and attached in ohmic contact to their respective lands on the substrate. Still another object of the invention is to provide a method of attaching solder balls to laminate carriers in a PBGA process with only one furnace reflow using IMS technology. It is also an object of the invention to avoid damage or destruction to any substrate, component, base plate or mold and to reuse the mold and base plate in the processing of a large number of substrates.

These and other objects are accomplished in the present invention using an injection mold which includes on its second major surface a blind recess and at its first major surface a head, or reservoir, for delivery of molten solder to an array of through-holes in the mold which are double chamfered, i.e. fluted, with the wide ends facing outward at both ends of a through-hole which is shaped somewhat like an hour glass, a base plate for containing the molten solder within the through-holes until solder balls are formed and attached to a substrate, and a substrate for receiving the solder balls at their respective contact lands.

Because of the uniqueness of the shape of the through-hole, molten solder flows into the upper chamfer, filling the through-hole, and is released from the lower chamfer to the contact land of the substrate as a solder ball during reflow. The combination of non-wettability of the mold material, the double chamfers and the aspect ratio of the mold through-holes permit the solder balls to form and release cleanly during reflow. Only one reflow step is required. The base plate and the injection mold can be made of the same material as the PCB substrate, or of a different non-wettable material having a substantially similar coefficient of thermal expansion (CTE). The non-wettability of the base plate material helps assure that the solder will form a ball and not stick to the base plate. The material of which the mold is made must be non-wettable so that the solder balls will form and adhere to the substrate without leaving solder residue within the walls of the mold through-holes. A clean mold can be reused easily. The mold material in the present invention has a life of about 10,000 usages and is compatible with the temperature of the molten eutectic solder. The CTE compatibility assures that solder balls in the mold through-holes will transfer to the PCB in the places desired, and that the mold material will not crack during solder transfer. It may be necessary to apply pressure between the mold and the substrate during reflow if, as a result of the material chosen, there is slight deviation from absolute flatness of these two parts with respect to each other at the temperature of the molten solder.

BRIEF DESCRIPTION OF THE DRAWINGS

FIGS. 3A–3F is a series of cross-sectional side view drawings showing 6 key steps in the PBGA injection molded soldering process.

DESCRIPTION OF THE PREFERRED EMBODIMENTS

Figure 1B:
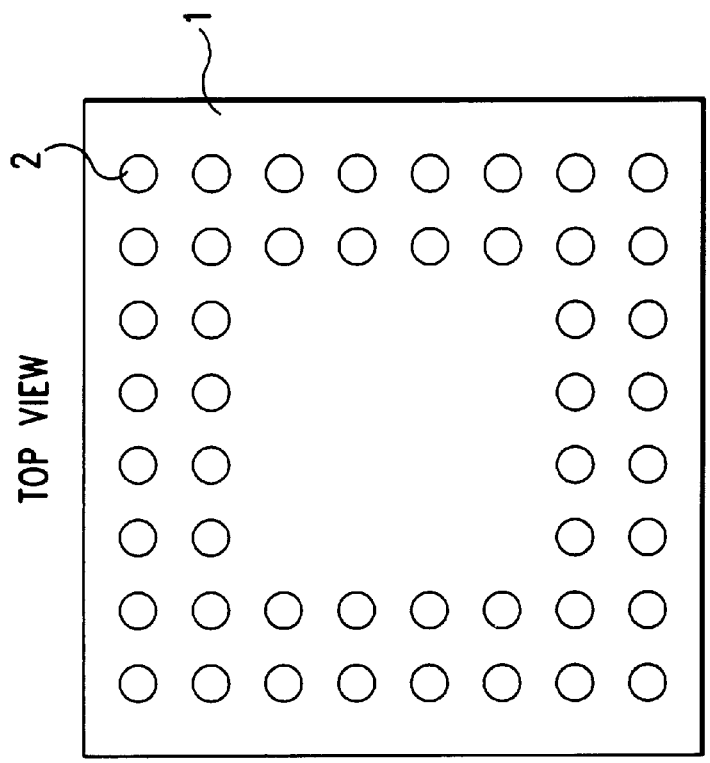
FIG. 1B is a drawing, seen from the bottom, of the top piece of the PBGA mold, showing the through holes to be filled with solder and a blind recess at the center.
Figure 1A:
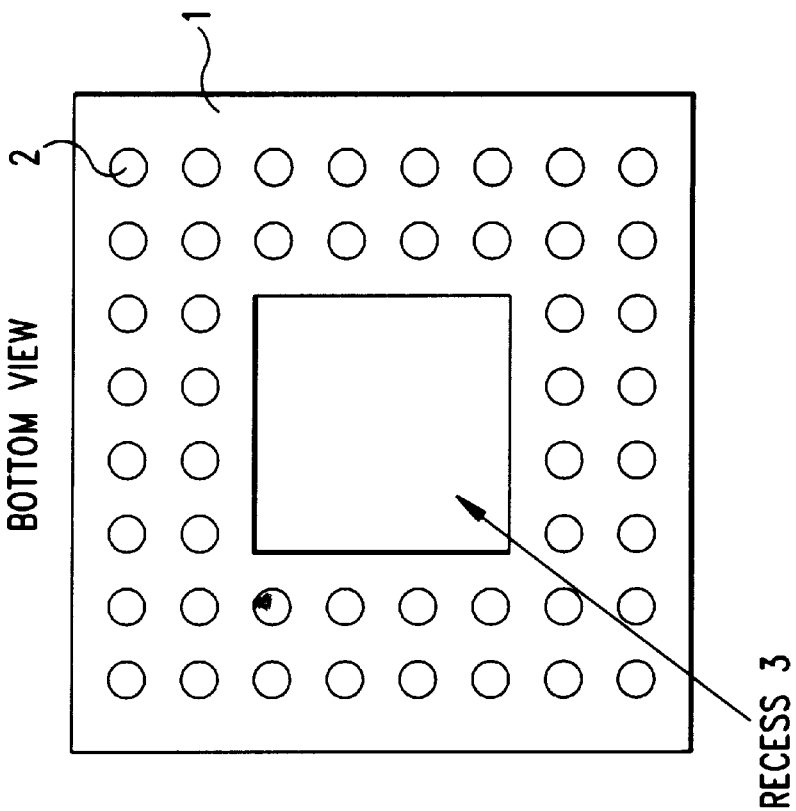
FIG. 1A is a drawing, seen from the top, of the top piece of the PBGA mold, showing the through holes to be filled with solder.

In order to facilitate understanding of the present invention, reference is made to the following detailed description taken in conjunction with the drawings:

FIG. 1A is a view of the first major surface of PBGA injection mold 1 with first openings of through-holes 2 arranged in a peripheral array. The aspect ratio (depth:unchamfered width) of the hole is 1:1 or less, preferentially about 3:4 to about 1:2, a suitable width at center being about 0.035 inches. The solder is inserted into the mold at this end of through-holes 2 from a reservoir of molten solder, shown in FIG. 3 as feature 5, which is presented in more detail in U.S. Pat. No. 5,244,143. The temperature of the molten solder can be monitored in the reservoir for quality control. The mold is preferably comprised of graphite or FR4 resin laminate so that it has a (CTE) the same as, or substantially similar to, that of the PCB which is to receive the reflowed solder. Compatible CTEs will assure that the through holes containing the reflowed solder will attain alignment with the lands in the PCB that will receive the solder balls and that the mold itself will not crack at the heated solder temperature. FIG. 1B is a view of the second major surface of the PBGA injection mold 1 showing the second openings of mold through-holes 2, i.e. ends opposite to those seen in 1A. At the ends seen in FIG. 1B, solder balls 8 (not shown) will emerge after reflow and cooling to join to lands 10 on the substrate 6 (all shown in FIG. 2B). Blind recessed area 3 shown at the center of FIG. 1B is shaped to accommodate, with clearance, IC chip 7 (shown in FIG. 3E) mounted on PCB substrate 6 during solder transfer from the injection mold 1 to the PCB lands 10.

Figure 2A:
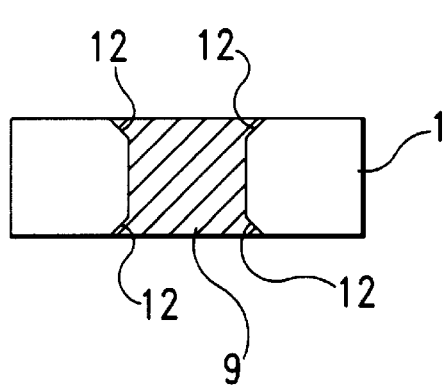
FIG. 2A is a cross-sectional side view showing the profile of solder-filled through-holes of the PBGA mold prior to reflow.
Figure 2B:
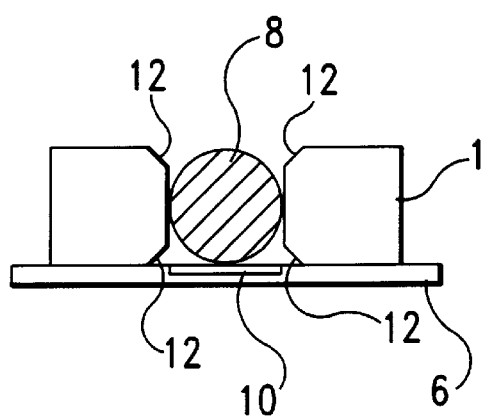
FIG. 2B is a cross-sectional side view showing the profile of a through-hole of the PBGA mold after reflow.

FIG. 2A is a cross sectional side view of PBGA injection mold 1 showing through-hole 2 filled with solder 9 before reflow. Through-hole 2 includes chamfers 12, shown also in FIG. 2B, at both ends to facilitate receiving solder 9 in molten form at a first end and to facilitate the release of solder ball 8 (shown in FIG. 2B) at a second end after reflow. FIG. 2B shows the solder ball 8 attached to contact land 10 on substrate 6 after reflow and prior to removal of mold 1. In FIG. 2B, the solder 9 seen in FIG. 2A has retracted from the chamfered ends of the through-hole into the ball shape during reflow due to surface tension and has become attached to contact land 10 to which it is aligned.

FIG. 3 illustrates the overall process of PGBA solder injection molding in six cross-sectional side views. Although the illustrations A–F do not show it, all through holes 2 are chamfered as shown in FIG. 2. In FIG. 3A are seen the injection mold 1, the unfilled through holes 2, and the blind recess 3 to create overhead clearance for an IC chip 7 and any other components as seen in FIG. 3D. In FIG. 3B are seen injection mold 1 in position atop a temporary base plate 4. Base plate 4 must be able to withstand exposure to the temperature of molten solder without distorting, reacting chemically or being wet by the molten solder. IMS head 5, which is filled with eutectic solder (63%:37% Sn:Pb, reflow @183 degrees C.), is slideably mounted on the mold and is seen in motion toward the left with respect to the mold, having filled six through-holes 2 with solder, indicated as darker through-holes 9. Other solder compositions may be used, provided the properties of the composition selected are compatible with, and nondestructive of, the other materials in the PBGA. In FIG. 3C all through-holes 2 have been solder filled and the temporary base plate 4, which had been put in place in 3B to contain the molten solder 9 during filling of the through holes 2 from IMS head 5, has been removed, since the solder 9 is now solid within the chamfered through-holes 2. The substrate 6 may be treated with a small amount of flux, such as a water soluble flux or "no clean" flux, depending on whether the gaseous environment during transfer is oxidizing or not, e.g. whether it is air or nitrogen. Mold 1 is now ready to be lowered onto the top surface of a substrate 6, which has occurred in FIG. 3D. In the FIG. 3D example, blind recess 3 is covering, with clearance, two chips 7 mounted on substrate 6, and the solder is positioned in through-holes 2 over the contact lands 10 (not shown), which will each receive a ball 8 of transferred solder upon reflow. In FIG. 3E reflow has occurred. Because of the non-wettability of the material selected for the mold 1 and the chamfers 12 (not shown), surface tension of the molten solder 9 acts to contract the solder into a ball shape 8. During reflow, a metallurgical bond is formed between the solder ball 8 and the substrate land 10 (not shown). Therefore when cooling has occurred, the mold 1 can be lifted away without disturbing the bonded solder balls 8, leaving behind an array of solder balls 8 soldered to their respective lands 10 (not shown) in the completed PBGA substrate in FIG. 3F. If there will be a slight distortion of the substrate 6 and the mold 1 with respect to each other due to the solder temperature, pressure can be applied after alignment during reflow, i.e. between 3D and 3E.

While the invention has been described in conjunction with specific nonlimiting embodiments, many modifications will be apparent to those skilled in the art in light of the foregoing information. Accordingly, it is intended that the present invention embrace all such modifications as fall within the spirit and broad scope of the appended claims.

What is claimed is:

1. An injection solder mold comprising a first major surface and a second major surface, the major surfaces penetrated and connected by at least one double chamfered through-hole having a first chamfered opening at the first major surface and a second chamfered opening at the second major surface, wherein the width of the at least one through-hole is about equal to its height.

2. The injection mold set forth in claim 1, wherein the material of which the mold is comprised is selected to be substantially non-wettable by the solder.

3. The injection mold set forth in claim 1, wherein the material of which the mold is comprised is selected to have a coefficient of thermal expansion substantially similar to that of a substrate onto which the solder will be transferred.

4. The injection mold set forth in claim 1, wherein the material of which the mold is comprised is graphite, FR4 resin laminate or a combination thereof.

5. The injection mold set forth in claim 1, wherein the width is about 0.035 inches.

6. The injection mold set forth in claim 1, wherein the aspect ratio of the at least one through-hole is between about 3:4 and about 1:2.

7. The injection mold set forth in claim 1, wherein a blind recess is provided in the second major surface.

8. The injection solder mold set forth in claim 1 comprising also a blind recessed area to accommodate, with clearance, an IC chip.

* * * * *